United States Patent
Ozawa et al.

(10) Patent No.: US 6,288,583 B1
(45) Date of Patent: Sep. 11, 2001

(54) PLL SYNTHESIZER CIRCUIT

(75) Inventors: Toshiyuki Ozawa, Oota; Kazuhiro Kimura, Fukaya; Hiroyoshi Kaneyama, Nitta-gun; Takayuki Ohashi, Ora-gun; Akira Yamazaki, Kiryu, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/447,310

(22) Filed: Nov. 22, 1999

(30) Foreign Application Priority Data

Nov. 26, 1998 (JP) ................................. 10-335875

(51) Int. Cl.[7] ................ H03K 9/16; H03K 5/13
(52) U.S. Cl. .......... 327/113; 327/157; 327/148; 327/156; 331/1 A
(58) Field of Search .................... 327/156, 157, 327/147, 148, 160, 151, 105, 113; 331/1 A

(56) References Cited

U.S. PATENT DOCUMENTS

| 4,562,410 | 12/1985 | O'Rouke | 331/1 A |
| 5,334,952 | * 8/1994 | Maddy et al. | 331/1 A |

FOREIGN PATENT DOCUMENTS

| 0 768 756 A2 | 4/1997 | (EP) . |
| 0 595 787 A2 | 5/1997 | (EP) . |
| 0 907 252 A | 4/1999 | (EP) . |

OTHER PUBLICATIONS

Communication and Search Report dated Mar. 16, 2000 from European Patent Office regarding European Patent Application No. 99309300.

IEEE Transactions on Consumer Electronics, "Fast Settling PLL Frequency Synthesizer Utilizing the Frequency Detector Method Speedup Circuit", Yasuaki Sumi, et al. Aug. 1998, vol. 43, No.3.

* cited by examiner

Primary Examiner—Dinh T. Le
(74) Attorney, Agent, or Firm—Hogan & Hartson LLP

(57) ABSTRACT

For frequency change, the VCO is controlled through a sub-charge pump circuit to make a determination as to whether or not a difference of dividing data between before and after the change is within a predetermined range. When it is determined that the difference is outside the predetermined range, the loop filer is forcibly charged in a charge time which is determined proportional to the difference in the dividing data, to thereby control an oscillation frequency of the VOC. A large VOC oscillation frequency change can be swiftly realized. Also, while the frequency change circuit is controlling the oscillation frequency, a time constant of the loop filter in the PLL circuit is preferably set at a small value, so that frequency change by the frequency change circuit can be swiftly achieved.

20 Claims, 12 Drawing Sheets

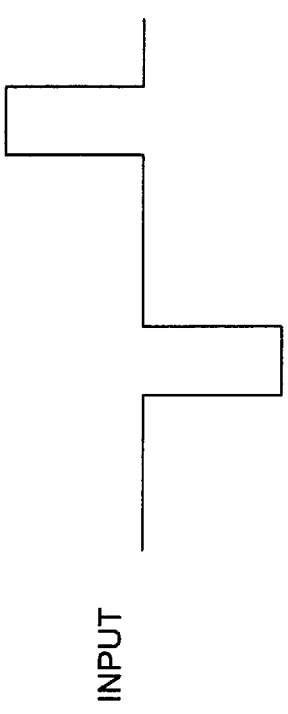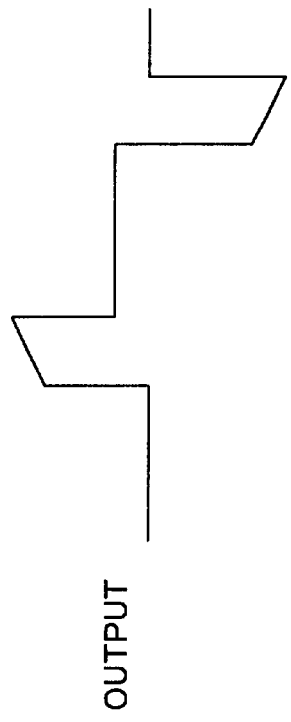

PLL SYNTHESIZER CIRCUIT

BACKGROUND OF THE INVENTION

1. Field of the Invention

The present invention relates to a PLL synthesizer circuit for preferable use in an RDS radio receiver or the like requiring fast switching of its local oscillation frequency when changing receiving broadcasting stations.

2. Description of the Related Art

Generally, electric tuner radio receivers generate a local oscillation signal in PLL (phase locked loop) synthesizer circuits, as shown in FIG. 1. As a PLL included in the PLL synthesizer circuits is a conventional art, ordinary operation of a PLL synthesizer circuit will not be described here, but PLL operation to change the frequency of a local oscillation signal in the PLL synthesizer circuit will be described.

Initially, based on the frequency of a broadcasting station to be received, dividing data on the dividing ratio of the frequency is supplied to a programmable divider 1. Based on the dividing data, the dividing number of the programmable divider 1 is changed, and the phase of an output from the program divider 1 is changed accordingly. Then, a phase comparator 3 compares phases of a reference signal from a reference signal generator 2 and of an output from the programmable divider 1 for every cycle of a reference signal, and a charge pump circuit 4 generates an error signal according to the phase difference. The error signal is smoothed by a loop filter 5 into a DC voltage, which is to be referred to as a control voltage in a VCO (a voltage control oscillation circuit) 6. The oscillation frequency of the VCO 6 is changed according to the control voltage. The VCO 6 is repeatedly modified as described above such that an output phase of the programmable divider 1 gradually becomes closer to the phase of the reference signal. Finally, when the above two phases become identical, the PLL circuit is locked, and the oscillation frequency of the VCO 6 is set at a frequency in accordance with the dividing data, i.e., the frequency of the receiving broadcasting station.

An output signal (a local oscillation signal) from the VCO 6 is mixed with an RF amplifying signal in a mixer into an intermediate frequency (IF) signal. An IF signal always has a constant frequency, while the local oscillation frequency is changed according to the receiving broadcasting station.

Conventionally, in order to change an output frequency of a PLL synthesizer circuit, operation must be repeatedly performed, including phase comparison between a reference signal and an output from the programmable divider 1, and output of an erroneous signal based on the comparison result. This operation is generally repeated a few hundred times after the start of frequency change until completion of locking the PLL, each every cycle of a reference frequency. Therefore, for a 50 kHz reference frequency, 20 μsec is required to complete one complete process of this operation (i.e., from phase comparison to change of the VCO oscillation frequency), and thus (20 μsec×a few hundred times) elapses from the start of the change to the completion of locking the PLL.

In radio broadcasting in Europe, traffic information is commonly superimposed on general broadcasting. Such broadcasting with superimposed traffic information is known as RDS (Radio Data System) Broadcasting, and reception requires that a receiver have a dedicated tuner for the traffic information. Such RDS tuners have various additional functions utilizing traffic information. One example of such functions may be a search for a substitutional station to replace a currently receiving station becoming hardly receivable, using program identifying data contained in such traffic information. To achieve this function, such a search must be continually applied while any broadcasting station is being received to ensure constant availability of a potential substitutional station. In such a search, the receiving frequency must be swiftly changed from that of the current station to that of the potential substitutional station, RDS data on and receiving condition of the potential substitutional station must be checked, and the receiver frequency must be swiftly changed back from the one for the potential substitutional station to the one for the current station.

However, as the PLL synthesizer circuit of FIG. 1 requires a long time from the beginning of frequency change to completion of locking of the PLL, a long time is required to complete frequency change to one for a potential substitutional station and back to the current station. This may lead to a problem such that reception of the current station is temporarily cut off, causing unfavorable reception conditions for the listener.

SUMMARY OF THE INVENTION

The present invention aims to provide a PLL synthesizer circuit capable of completing locking of the PLL in a reduced time period compared to a conventional one.

According to the present invention, an output frequency of the PLL circuit is forcibly changed by the frequency change circuit. Therefore, change of the frequencies of the PLL circuit, and thus of receiving stations by the radio receiver, can be completed in a shorter time. As change to a substitutional station can be swiftly achieved, particularly in a substitutional station search by an RDS radio receiver, listener annoyance can be prevented.

Further, when the frequency change circuit is not operating for frequency change, supply of system clocks to the frequency change circuit is preferably halted to prevent noise and to avoid deterioration of the properties of an IF circuit in a radio receiver or the like due to such noise from the frequency change circuit.

Also, preferably, a gate time (a measurement time) for the frequency counter in the frequency change circuit is set by the gate time set circuit according to a difference between a count value counted by the frequency counter and the dividing data supplied from the deciding portion. With the above, a gate time for the frequency counter can be set short when frequency detection accuracy is not highly required, and longer when it is required. Consequently, a processing time for the frequency change circuit can be reduced, while an accurate frequency can be output from the PLL.

Further, preferably, the frequency change circuit controls the PLL circuit so as to output a frequency at a predetermined value in response to a reset request signal, which is generated when turning on the power and so on. With the above, the VCO control voltage for the PLL circuit can be forcibly raised so that erroneous operation due to deadlock situation, which might otherwise be caused when turning on the power, can be prevented.

Further, preferably, the time constant of the loop filter is set smaller when the frequency change circuit carries out operation for changing an output frequency of the PLL circuit than when it does not. With the above, the frequency change by the frequency change circuit can be accelerated.

BRIEF DESCRIPTION OF THE DRAWINGS

The above and other objects, features, and advantages of the present invention will become further apparent from the following description of the preferred embodiment taken in conjunction with the accompanying drawings wherein:

FIGS. 12A and 12B are diagram showing waveforms of a control signal for and an output signal from a loop filter, respectively; and FIGS. 13A and 13B are diagrams showing waveforms of a control signal for and an output signal from a loop filter, respectively.

DESCRIPTION OF THE PREFERRED EMBODIMENTS

First Embodiment

Figure 2:
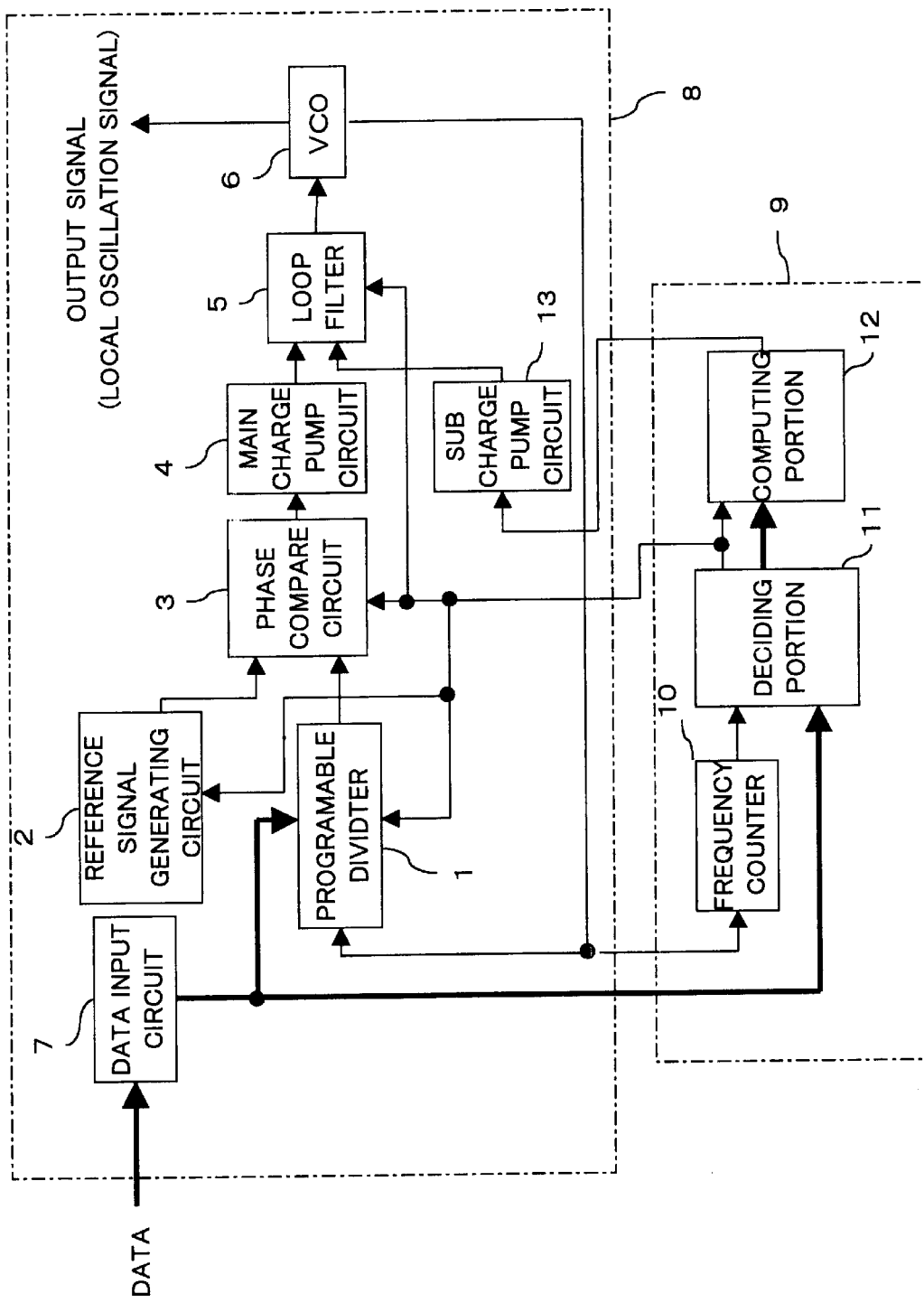
FIG. 2 is a diagram showing a structure of a PLL synthesizer circuit according to a first preferred embodiment of the present invention.

FIG. 2 is a block diagram showing a preferred embodiment of the present invention.

Figure 1:
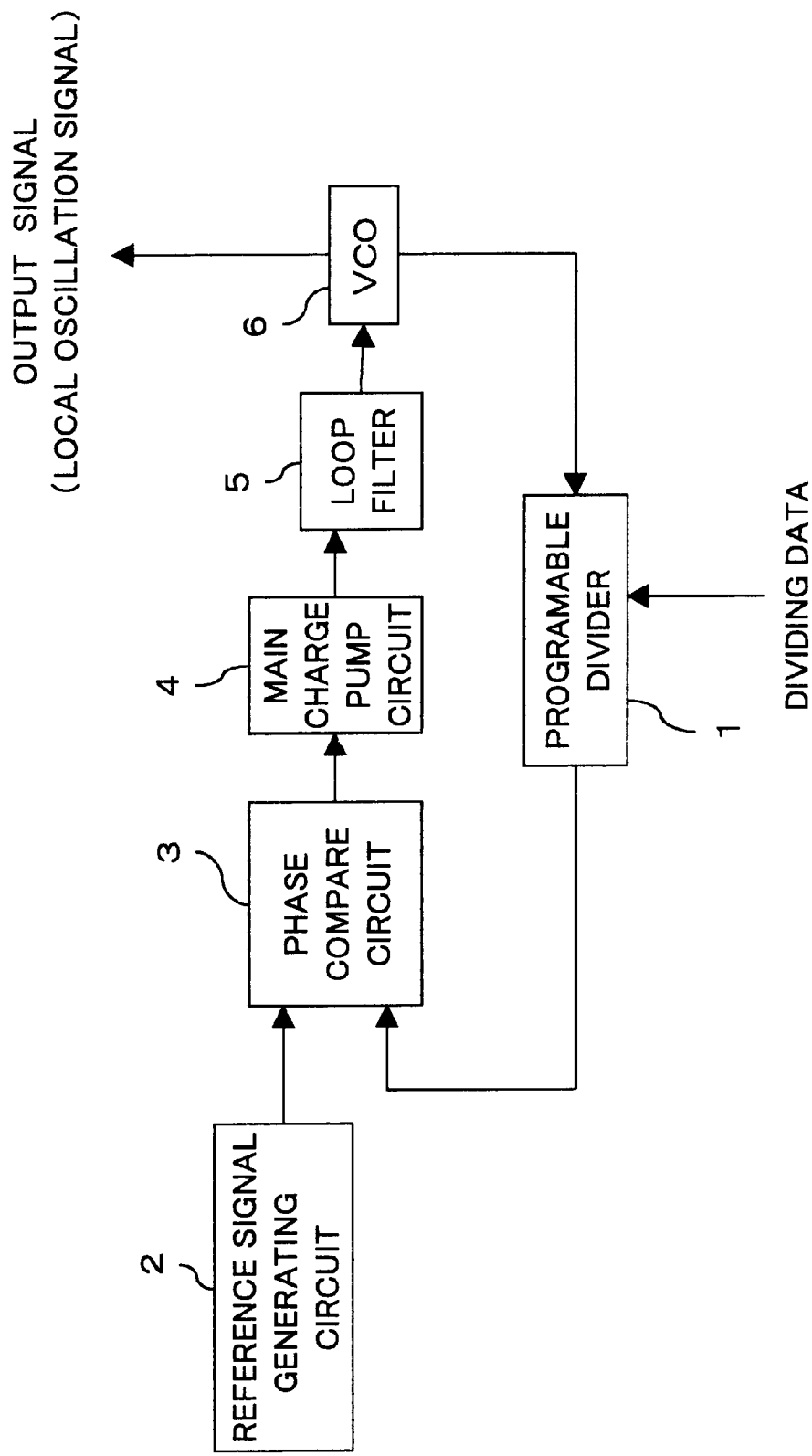
FIG. 1 is a circuitry diagram showing a structure of a conventional PLL synthesizer circuit.

PLL circuit 8 has the same structure as that of the circuit shown in FIG. 1. Based on the frequency of a receiving broadcasting station, dividing data on the dividing ratio for the frequency is supplied to a programmable divider 1. Based on the dividing data, the dividing number of the programmable divider 1 is changed, and an output of the divider 1 is accordingly changed. In a phase compare circuit 3, the phase of a reference signal from a reference signal generating circuit 2 is compared with that of an output from the programmable divider 1 for every cycle of a reference signal, and a main charge pump circuit 4 generates an error signal based on the phase difference. The error signal is smoothed by a loop filter 5 into a DC voltage, which is supplied to as a control voltage in the VCO (voltage control oscillation circuit). The oscillation frequency of VOC 6 is changed according to the control voltage. The VCO 6 is repeatedly modified as described above such that an output phase of the programmable divider 1 gradually becomes closer to the phase of the reference signal. Finally, when the above two phases become identical, the PLL circuit is locked, and the oscillation frequency of the VCO 6 is set at a frequency in accordance with the dividing data, i.e., the frequency of the receiving broadcasting station.

In this embodiment, a frequency change circuit 9 is additionally provided, which comprises a frequency counter 10 for counting the frequency of the VCO 6, a deciding portion 11 for determining whether or not the counted frequency is within a predetermined range, and a calculating portion 12 for calculating an amount by which to change an output level of the loop filter 5, based on the determination result obtained by the deciding portion 11. The PLL circuit 8 additionally comprises a sub-charge pump circuit 13 for generating an error signal in accordance with an output from the calculating portion 12.

Figure 3:
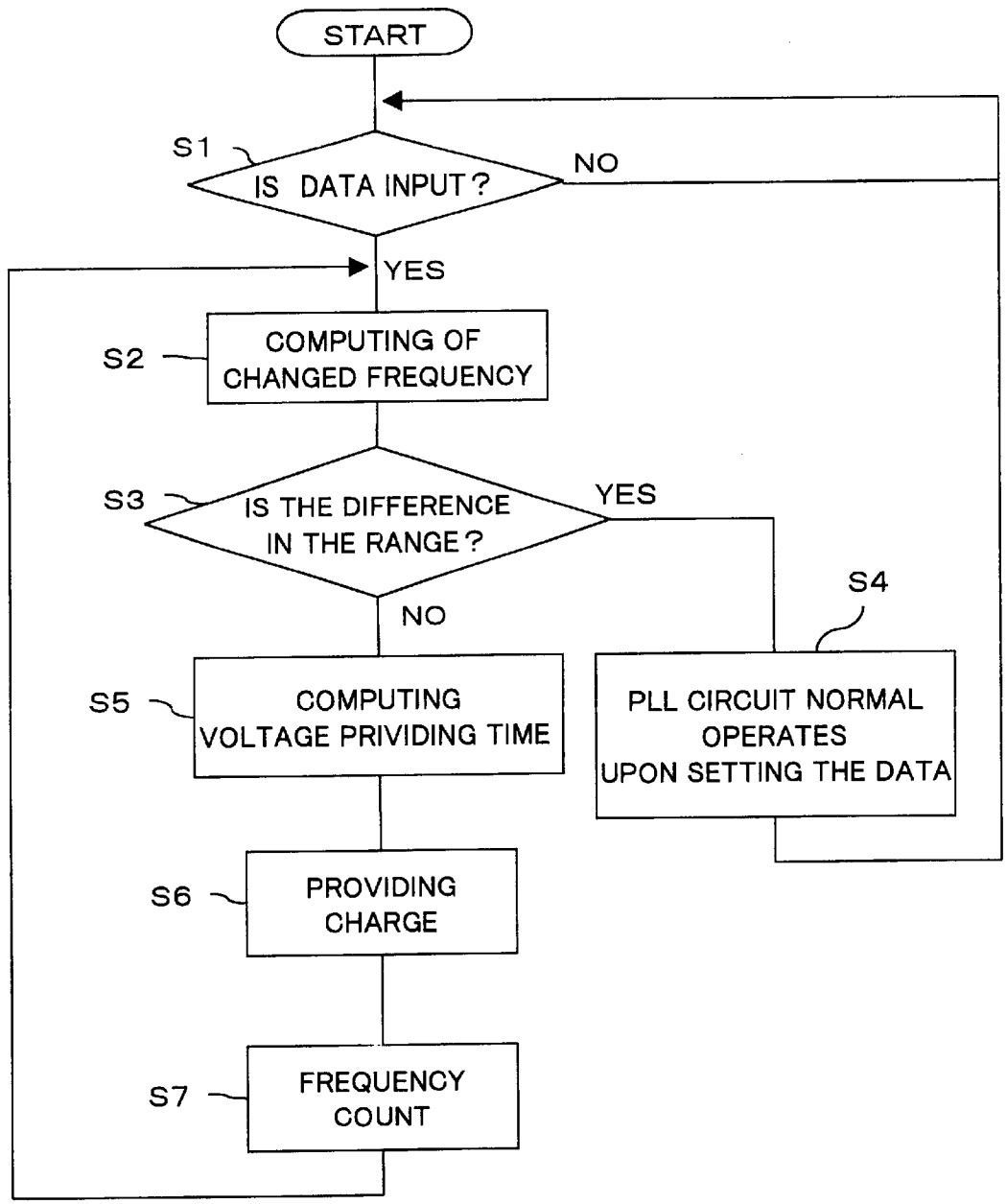
FIG. 3 is a flowchart for operation of the circuit according to the first preferred embodiment.

Frequency change operation of FIG. 2 will be described, referring to the flowchart of FIG. 3.

Initially, whether or not the data input circuit 7 is receiving dividing data from an external control circuit is determined (S1). With no input, the data input circuit 7 remains in a data awaiting state until data reception. When any data is input, on the other hand, the data input circuit 7 supplies the dividing data to the deciding portion 11 only, as data input to the programmable divider 1 remains inhibited at this stage.

The deciding portion 11 calculates a difference between the supplied dividing data (new data) and dividing data before the change of a dividing number (previous data) (S2), and determines whether or not the difference is within a predetermined range (S3). The last input dividing data is held intact in the deciding portion 11 for use in comparison with the next input dividing data.

When the dividing data difference within a predetermined range is determined, the frequency change circuit 9 halts frequency change operation, and the dividing data held in the data input circuit 7 is supplied to the programmable divider 1. Then, the dividing number of the programmable divider 1 is changed accordingly. Thereafter, the oscillation frequency of the VCO 6 is changed such that the phase of an output signal from the programmable divider 1 coincides with that of a reference signal from the reference signal generation circuit 2, and ordinary operation is then applied to lock the PLL circuit 8 (S4).

When the difference outside a predetermined range is determined, the deciding portion 11 generates a reset signal to reset the programmable divider 1, the reference signal generating circuit 2, and the phase compare circuit 3. The deciding portion 11 also generates a stop signal to halt operation of the main charge pump circuit 4. Based on the reset signal from the deciding portion 11, the time constant for the loop filter 5 is changed to be smaller.

Upon the rise of a reset signal, the calculating portion 12 is activated. The calculating portion 12 is responsible for calculation of a charge application time with respect to the sub-charge pump circuit 13, based on a difference between the dividing data and the previous dividing data, sent by the deciding portion 11. When performing such a calculation for the first time after the change of a dividing number, an amount of time proportional to a dividing difference (a difference between the previous dividing number and the new dividing number) is used as a charge application time. Specifically, when a dividing difference is denoted as DD and a charge application time is as Tc1, the expression Tc1=α×DD is obtained, and a charge application time Tc1 is calculated based on this expression (S5).

After a charge application time Tc1 was calculated, a charge control signal with a pulse width equivalent to the time Tc1 is applied to the sub-charge pump circuit 13. Accordingly, the sub-charge pump circuit 13 outputs a pseudo error signal to the loop filter 5. With such forcible charge, an output voltage of the loop filter 5 is varied, and, consequently, so is the oscillation frequency of the VCO 6 (S6). Thereafter, when the oscillation frequency of the VCO 6 is stabilized, the frequency counter 10 starts counting the oscillation frequency of the VCO 6 (S7).

After counting is completed, the operation flow returns to step S2. In calculation of this time or thereafter, i.e., in calculations performed for the second or thereafter times after the dividing frequency change, however, a difference between the count value counted by the frequency counter 10 and the set dividing data is obtained, rather than a difference between the dividing data to be changed and the dividing data before the change, obtained in the calculation for the first time after the dividing frequency change. Thus, a difference between the current oscillation frequency of the VCO 6 and a frequency corresponding to the dividing data to be set to the PLL circuit can be obtained in the deciding portion 11, and it is determined whether or not this difference is within a predetermined range.

Here, the frequency counter 10 counts the number of local oscillation signals supplied from the VCO 6 during one cycle of a reference signal from the reference signal generating circuit 2 of the PLL circuit. The PLL circuit 8 divides, via the programmable divider 1, a local oscillation signal from the VCO 6 based on the dividing data such that the resultant signal becomes identical to the reference signal. Therefore, with the PLL locked, the number of cycles of the local oscillation signal supplied during one cycle of a reference signal should be the same as the dividing number (dividing data). Then, the deciding portion 11 compares the count value counted by the frequency counter 10 with the dividing data to obtain a difference thereof.

When the difference between the count value counted by the frequency counter 10 and the set dividing data (which corresponds to the frequency data) is within a predetermined range, the reset signal and halted operation of the main charge pump circuit 4 are released to thereby resume operation of the PLL circuit 8 for locking.

When the difference is outside a predetermined range, a charge time Tc2 (or Tc(N)) is calculated based on the difference. For such calculations being applied for the second time and thereafter after the change of a dividing number differs from the first calculation after the change, wherein an amount of time proportional to the dividing difference is used for a charge application time Tc1 (or Tc(N−1)), in that a charge time Tc2 is obtained from the following expression. Specifically, when the last obtained charge time is denoted as Tc(N−1); an oscillation frequency having been changed when Tc(N−1) was applied is as ΔF; a difference between the count value counted by the frequency counter and the set dividing data is as ΔDa, the expression (1)

$$Tc2 = (Tc1/\Delta F) \times \Delta DA \quad (1)$$
$$= (Tc(N-1)/\Delta F) \times \Delta Da = Tc(N)$$

is obtained. A charge time is controlled using this expression, in accordance with the properties obtained resulting from the previous frequency change, for more accurate control of an output frequency of the VCO 6.

After the charge application time Tc2 was calculated, a charge control signal with a pulse width equivalent to the time Tc2 is applied to the sub-charge pump circuit 13. In response to this, the sub-charge pump circuit 13 outputs a pseudo error signal to the loop filter 5. Accordingly, an output voltage of the loop filter 5 is varied, and an oscillation frequency of the VCO 6 is accordingly varied. Thereafter, when the oscillation frequency of the VCO 6 is stabilized, the frequency counter 10 resumes counting the oscillation frequency of the VCO 6. After counting is completed, the operation flow again returns to step S2 to repeat the processes at S2 through S6 until the difference between the count value counted by the frequency counter 10 and the set dividing data has been reduced into within a predetermined range.

As described above, the amount of time necessary to charge the loop filter 5 enough to achieve frequency change can be accurately calculated based on the amount of changed frequency for the previous charging time. This enables sufficient charging for changing to the set frequency through only a few charge applications. Therefore, compared to a conventional PLL circuit, which requires a few hundred charge applications to complete such frequency change, a PLL circuit according to the present invention can significantly reduce the number of required charge applications for frequency change.

In the above, the sub-charge pump 13 is provided separately from the main charge pump 4 so that the oscillation frequency of the VCO 6 can be controlled from the outside of the PLL circuit by controlling the sub-charge pump 13 through the calculating portion 12. However, as shown in FIG. 4, the sub-charge pump 4 may be omitted, and instead the main charge pump 4 may be controlled according to a signal from the calculating portion 12.

That is, after inhibiting operation of the phase compare circuit 3, the main charge pump 4 is controlled in the same manner as described above with respect to the sub-charge pump 13. With such control, a voltage according to the value calculated by the calculating portion 12 can be output to the main charge pump 4, instead of an output from the phase compare circuit 3 of the PLL circuit 8, in the case of a significant change between before and after the frequency change. Consequently, the oscillation frequency can be swiftly changed closer to a target value (a frequency corresponding to that of a broadcasting station after the change). In addition, this method can obviate the sub-charge pump 13.

Second Embodiment

Figure 4:
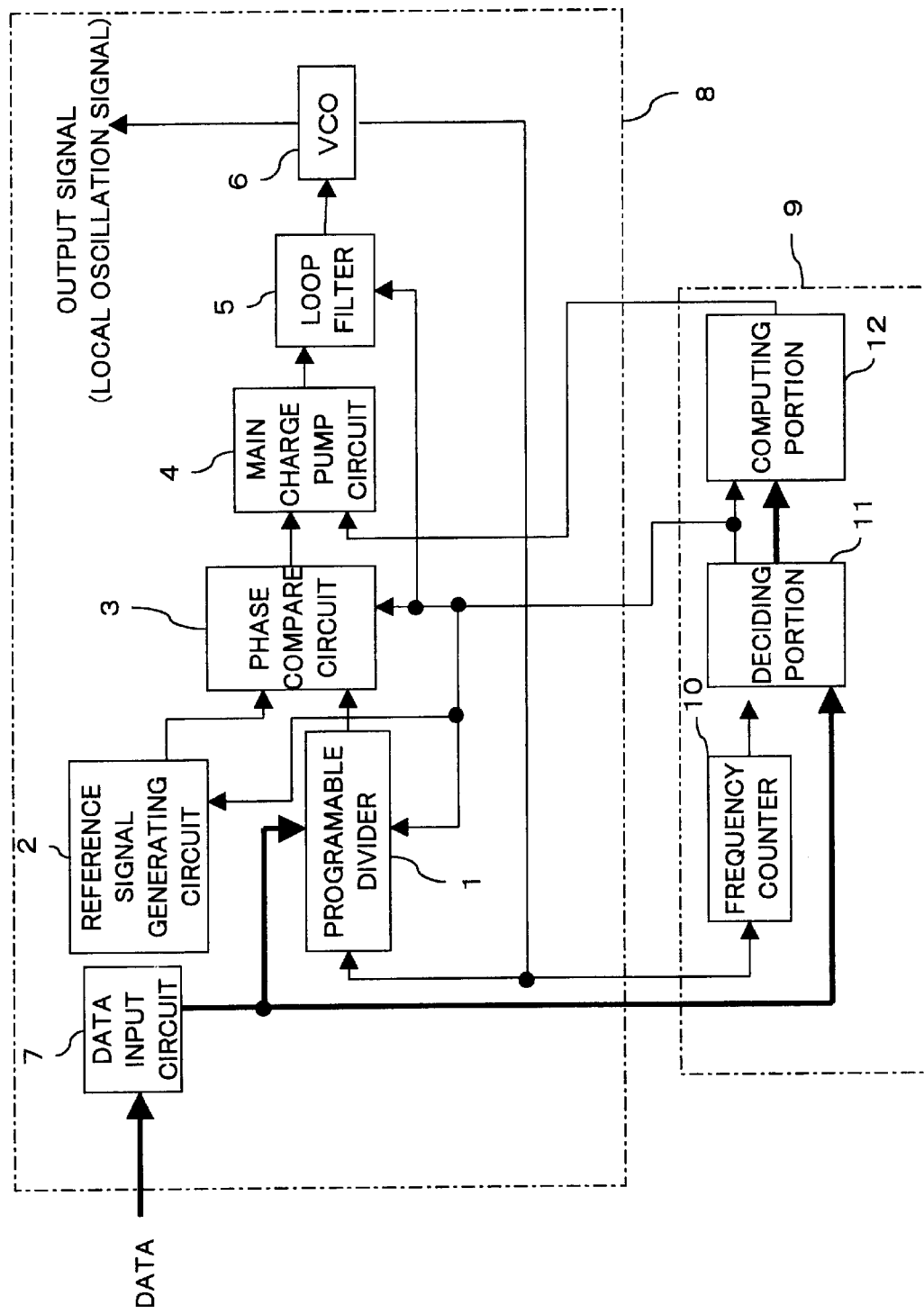
FIG. 4 is a diagram showing a modified structure of the circuit according to the first preferred embodiment.

The frequency counter 10, the deciding portion 11, and the calculating portion 12 of the frequency change circuit 9, shown in FIGS. 2 and 4, are generally synchronous circuits which operate in synchronism with a system clock supplied to the PLL circuit 8 or the like. Therefore, the frequency change circuit 9 requires a constant system clock. In other words, a system clock is supplied to the frequency change circuit 9 even when it is not in operation for frequency change.

Here, the frequency change circuit 9 comprises numbers of flip-flops for counting and data storage, and clock inputs of these flip-flops continually operate in response to a supplied system clock, inevitably causing unnecessary noises. Such noises may result in deteriorated properties of a high frequency-related noise-sensitive circuit, such as an input amplifier of a PLL circuit and an IF circuit in a radio receiver, or even miss-operation of such circuits. In order to address such a problem, in a second preferred embodiment, there is provided a PLL synthesizer capable of preventing such unnecessary noise generation.

Figure 5:
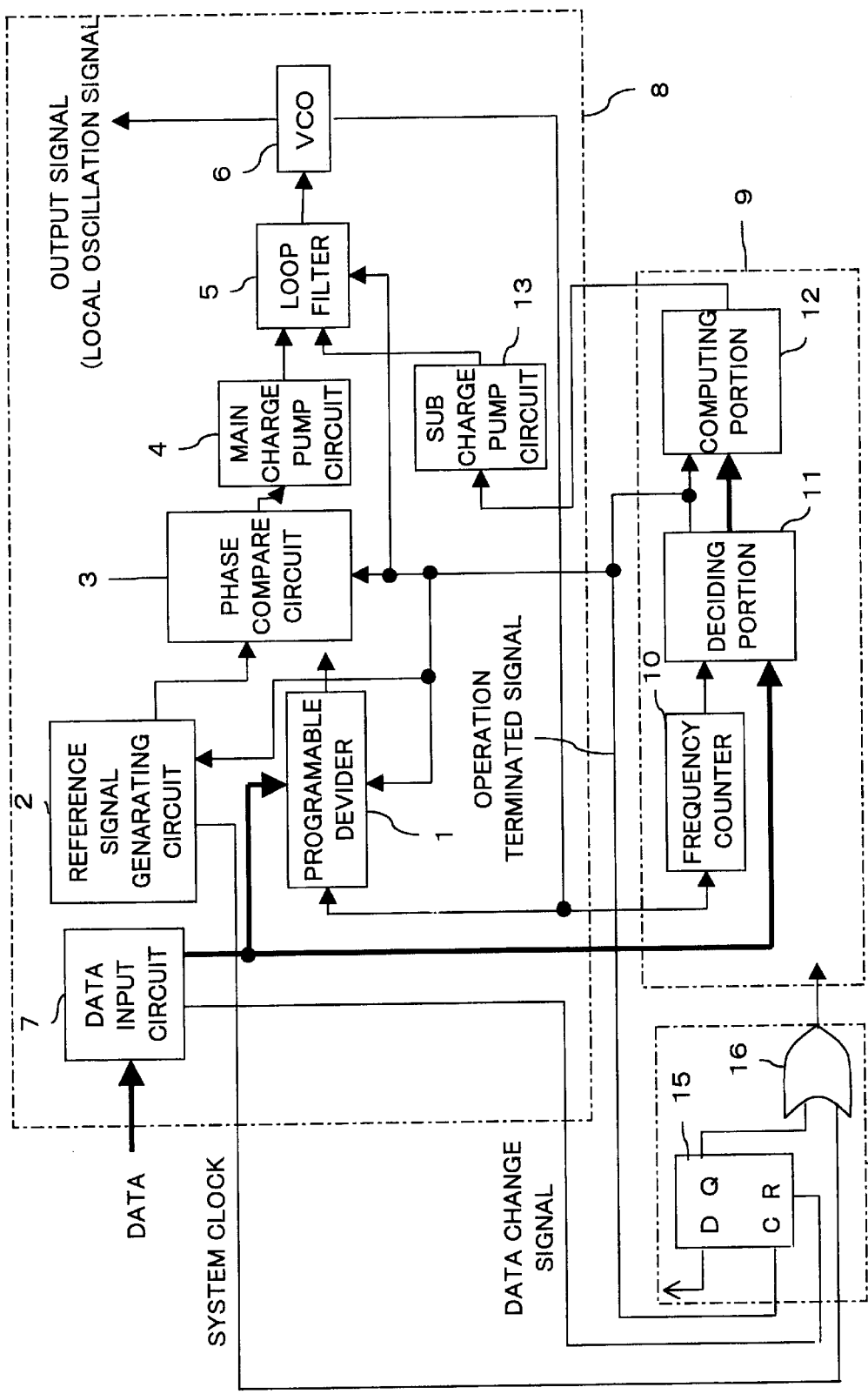
FIG. 5 is a diagram showing a structure of a PLL synthesizer circuit according to a second preferred embodiment of the present invention.

As shown in FIG. 5, a PLL synthesizer according to this embodiment additionally comprises a system clock stop circuit 14 for stopping supply of a system clock to the frequency change circuit 9 depending on the operation state of the circuit 9. Note that system clocks are generated in the reference signal generation circuit 2 in the PLL circuit 8, and may be of, for example, 7.2 MHz.

The system clock stop circuit 14 receives two types of signals, namely, a data change signal which is output upon change of control data from the data input circuit 7 in the PLL circuit, and a judgement signal, which is output from a deciding portion in the frequency change circuit 9. The system clock stop circuit 14 comprises a state preserve circuit (a D-type flip-flop) 15 for holding a control signal for controlling starting/blocking of supply of a system clock based on the state of these signals, and a control gate (an OR gate) 16 for controlling transmission/blocking of supply of a system clock to the frequency change circuit 9 according to an output of the flip-flop 15, the control signal controlling starting/blocking of supply of system clocks. Note that a data change signal is prepared in the data input circuit 7 when having received dividing data from the outside, and remains at H-level for a predetermined amount of time. Output timing for a data change signal corresponds to that for dividing data toward the deciding portion 11.

When a data change signal is received by the reset terminal of the flip-flop 15, an output from the flip-flop 15 is turned to L-level. Thereupon, the OR gate 16 initiates transmission of a system clock from the PLL circuit 8 to the frequency change circuit 9, and the frequency change circuit 9 then starts operation.

As an operation completion signal from the deciding portion 11 is introduced into the clock input terminal of the flip-flop 15 in the system clock stop circuit 14, the data input terminal D of the flip-flop 15 is turned to H-level. Therefore, in response to the rise of an operation completion signal, an output from the flip-flop 15 is turned to H-level. Note that an operation completion signal corresponds to a signal for releasing a reset signal, which is output for judgement "NO" made by the deciding portion 11 at S3. An operation completion signal remains H-level for a predetermined amount of time.

With the flip-flop 15 set at H-level, an output from the OR gate 16 is fixed at H-level whereby supply of system clocks to the frequency change circuit 9 is blocked. As a result, no noise is generated by the frequency change circuit 9.

In order to change frequencies again, frequency data (new dividing data) is supplied to the data input circuit 7, upon which a data change signal is output. Then, an output from the flip-flop 15 becomes L-level, as a result of which a system clock is supplied to the frequency change circuit 9, as described above, with operation of the frequency change circuit resumed.

In this embodiment, system clocks are not supplied to the frequency change circuit when the circuit is not operating for frequency change. Consequently, no noise is generated, and thus deterioration of the properties of an IF circuit in a radio receiver due to noises from the frequency change circuit can be prevented.

Third Embodiment

The frequency counter 10 counts the number of clocks supplied during a constant gate time (one cycle of a local oscillation signal). Thus, with a longer gate time set, accuracy of frequency detection is improved, which allows more precise control. However, as such control requires a longer counting time, a time necessary for switching the local oscillation frequencies is resultantly prolonged. With a shorter gate time set, on the other hand, counting time can be shortened with a result that, despite deterioration of frequency detection accuracy, processing time is shortened.

In view of the above, in a third preferred embodiment, there is provided a PLL synthesizer circuit capable of frequency counting with adequate accuracy.

In this embodiment, the frequency counter 10 of the frequency change circuit 9 can change a gate time, during which local oscillation signals are counted.

Figure 6:
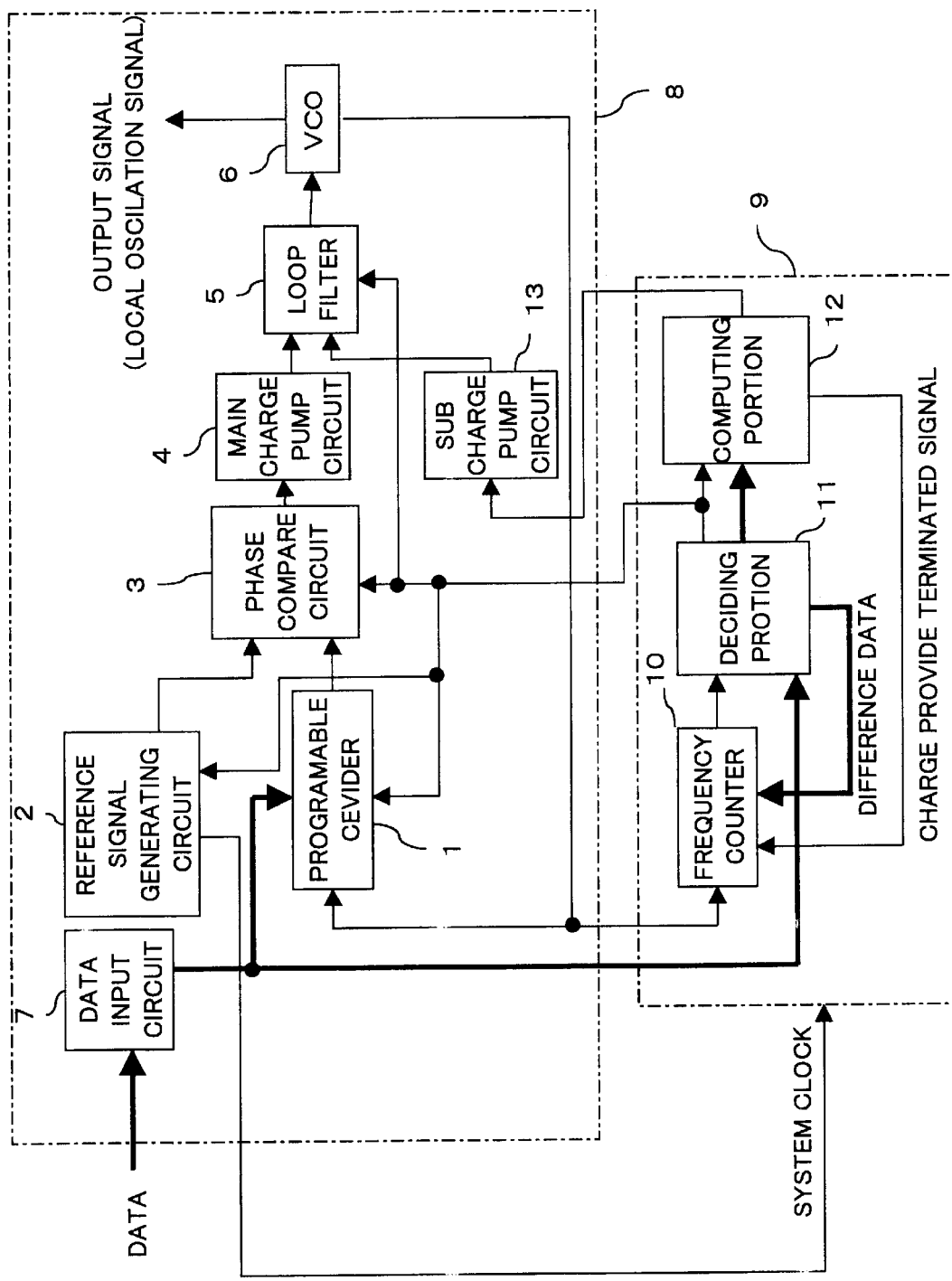
FIG. 6 is a diagram showing a structure of a PLL synthesizer circuit according to a third preferred embodiment of the present invention.
Figure 7:
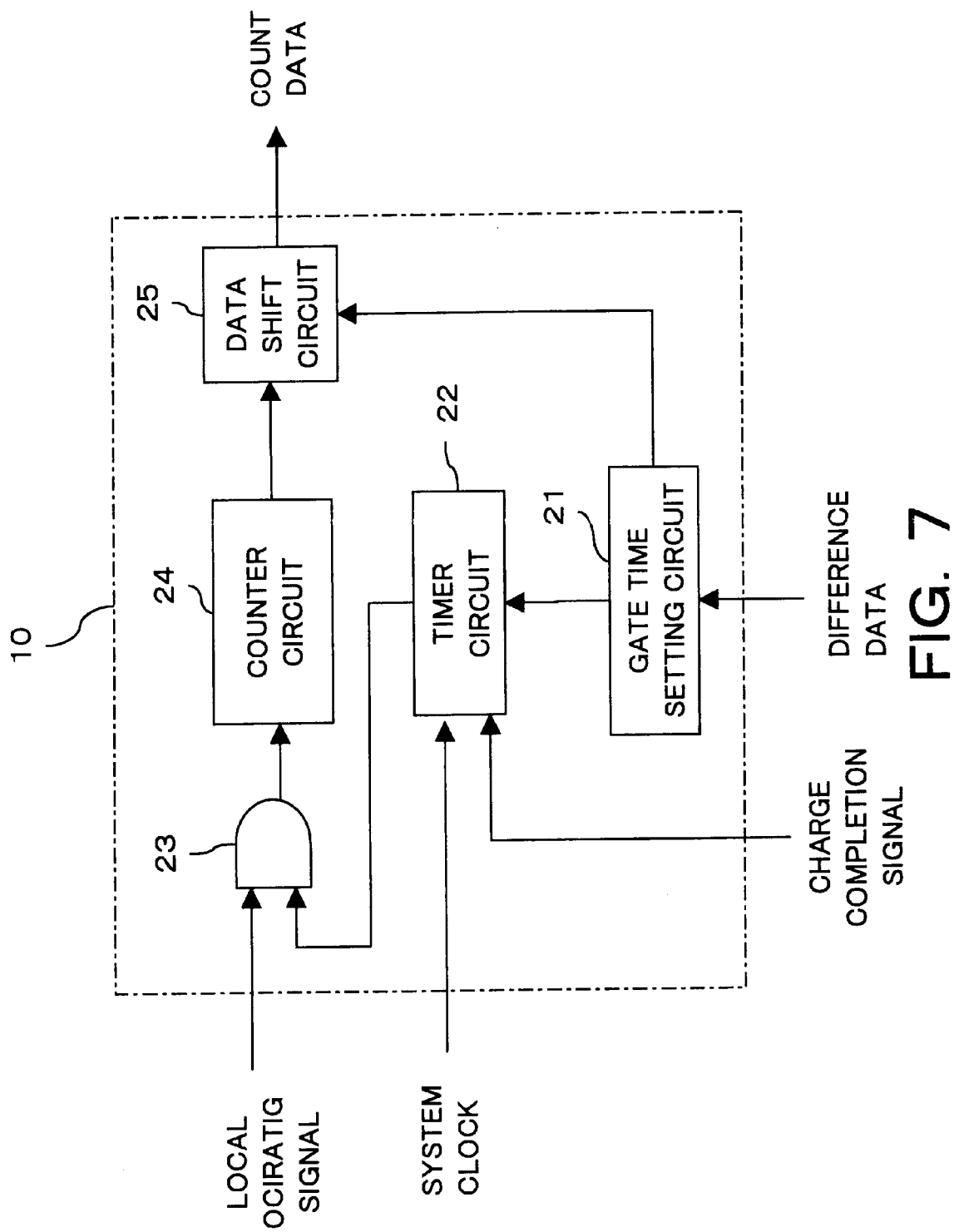
FIG. 7 is a diagram showing a circuitry structure for gate time setting.

That is, as shown in FIG. 6, a PLL synthesizer circuit of the third preferred embodiment comprises a gate time setting circuit 21 for receiving difference data from the deciding portion 11 to set a gate time, a timer circuit 22 for outputting a signal indicative of a gate time according to the set gate time, an AND date 23 for gating a local oscillation circuit by using an output from the timer circuit 22, a counter circuit 24 for counting an output from the AND gate 23, and a data shift circuit 25 for shifting output data from the count circuit 24 either leftward or rightward depending on the gate time set by the data time setting circuit 21.

As described above, the deciding portion 11 and the calculating portion 12 adjust the sub-charge pump circuit 13 such that the charging time matches with the frequency data set by the data input circuit 7. Then, the local oscillation signals from the VCO 6 are counted by the frequency counter 10 to see, via the deciding portion, whether or not a difference between the count value and the frequency set data for the data input circuit (dividing data) is within a predetermined range.

Here, frequency data obtained in the frequency counter 10 may not necessarily be highly accurate when previously measured frequency data on a local oscillation signal from the VCO 6 is significantly different from the set frequency data sent by the data input circuit. It should be noted that the deciding portion 11 compares a count value, or the number of local oscillation signals counted in a single cycle of a reference signal, and dividing data, as described above.

When a count value on the frequency counter 10 differs significantly from the dividing data from the deciding portion 11, some errors may be negligible in view of such a very large frequency change. Therefore, the gate time set circuit 21 selects a shorter gate time to reduce a frequency counting time.

Specifically, after receiving a charge application completion signal notifying completion of charging by the sub-charge pump circuit 13, the timer circuit 22 begins counting system clocks to generate a signal on a gate time, which is then supplied to the AND gate 23.

In response to the signal from the timer circuit 22, the period of time that the AND gate left open is accordingly reduced so that the counter circuit 24 can complete counting at an earlier timing. The thus obtained count value does not coincide with the dividing data. Then, the data shift circuit 25 shifts the count value so as to match with data which would be obtained by counting the local oscillation signal during a single cycle of a reference signal.

Specifically, the gate time set circuit 21 sets a gate time as a multiple of two. When the gate time is halved, the data shift circuit 25 shifts a count value by one bit toward the MSB side (i.e., leftward) to thereby double the counter value so that an output data becomes the same as data which would be obtained by counting the local oscillation signal during one whole cycle of a reference signal. With the gate time quartered, the data shift circuit 25 may apply two-bit shifting. Note that a counting period is not necessarily fixed at a single cycle of a reference signal, and may be set to a different time period.

As described above, as a count value is supplied to the deciding portion 11 at an earlier stage, frequency change control can be achieved in a shorter time.

When the output frequency data of the PLL circuit has become closer to set frequency data from the data input circuit (i.e., has fallen in a predetermined set range), control is made more accurate with the set frequency. Specifically, the gate time set circuit 21 selects a longer gate time. With such selection, the counter circuit 24 can achieve more accurate frequency count, and thus charge time calculation is more accurate.

For example, local oscillation signals are generally counted in one cycle of a reference signal (20 µsec), and this counting time period is modified to half or quarter depending on the difference data from the deciding portion 11. With the above, the frequency of a local oscillation signal from the VCO 6 can be made closer to a target frequency at a relatively early stage in processing, while detection accuracy enough to prevent a problem which would otherwise be caused in subsequently locking the PLL by the PLL circuit 8, can be ensured in judgement to therewith complete the processing by the frequency change circuit 9.

As described above, in this embodiment, a gate time (a measurement time), during which the frequency counter 10 in the frequency change circuit 9 actually makes counting, is set by the gate time set circuit 21 according to the difference between the count value counted by the frequency counter 10 and sent from the deciding portion 11, and the dividing data. With the above, the frequency counter 10 defines a shorter gate time when frequency accuracy is not highly required, and a longer gate time when it is severely required. With the above, a processing time for the frequency change circuit 9 can be reduced, while a highly accurate frequency can be output from the PLL circuit 8.

Note that the gate time set circuit 21 and the timer circuit 22 may be separately provided or formed in the calculating portion 12, rather than in the frequency counter 10.

Fourth Embodiment

Here, the output amplitude of the VCO 6 tends to be as small as possible to suppress unnecessary radiation from the closest oscillation source. With a smaller output amplitude of the VCO 6, the VCO 6 may likely present properties such as no oscillation at small control voltages, e.g., a voltage around 0 V. Moreover, a sufficiently large amplitude gain must be ensured, even though the output amplitude of the VCO 6 is small, to allow operation of the programmable divider 1 and/or the frequency counter 10 in the frequency change circuit 9. Such an amplifier with a high gain and high frequency properties may sometimes be caused to oscillate due to noises from the outside or in the internal circuit when receiving no signal.

In the above PLL circuit and the frequency change circuit 9, immediately after power is switched on, an output voltage of the loop filter 5 of the PLL circuit 8, as well as a control voltage for the VCO 6, is substantially 0 V. In such a condition, an output from the VCO 6 becomes substantially 0 V, as a result of which the programmable diver 1 and/or the amplifier in the frequency counter 10 may cause self-oscillation. When such a self-oscillation frequency is higher than the frequency data having been input from the data input circuit 7, the deciding portion 11 in the frequency change circuit 9 determines a high VCO 6 frequency. Accordingly, the calculating portion 12 in the frequency change circuit 9 sends a charge application signal for reducing the VCO 6 frequency to the sub-charge pump circuit 13. Then, the sub-charge pump circuit 13 applies charging so as to reduce the VCO 6 output frequency. Consequently, the control voltage of the VCO 6 remains low without increasing, leading to a deadlock state.

According to the fourth preferred embodiment, there is provided a PLL synthesizer circuit capable of locking the PLL at a high speed, and of providing control when power is switched on.

Figure 8:
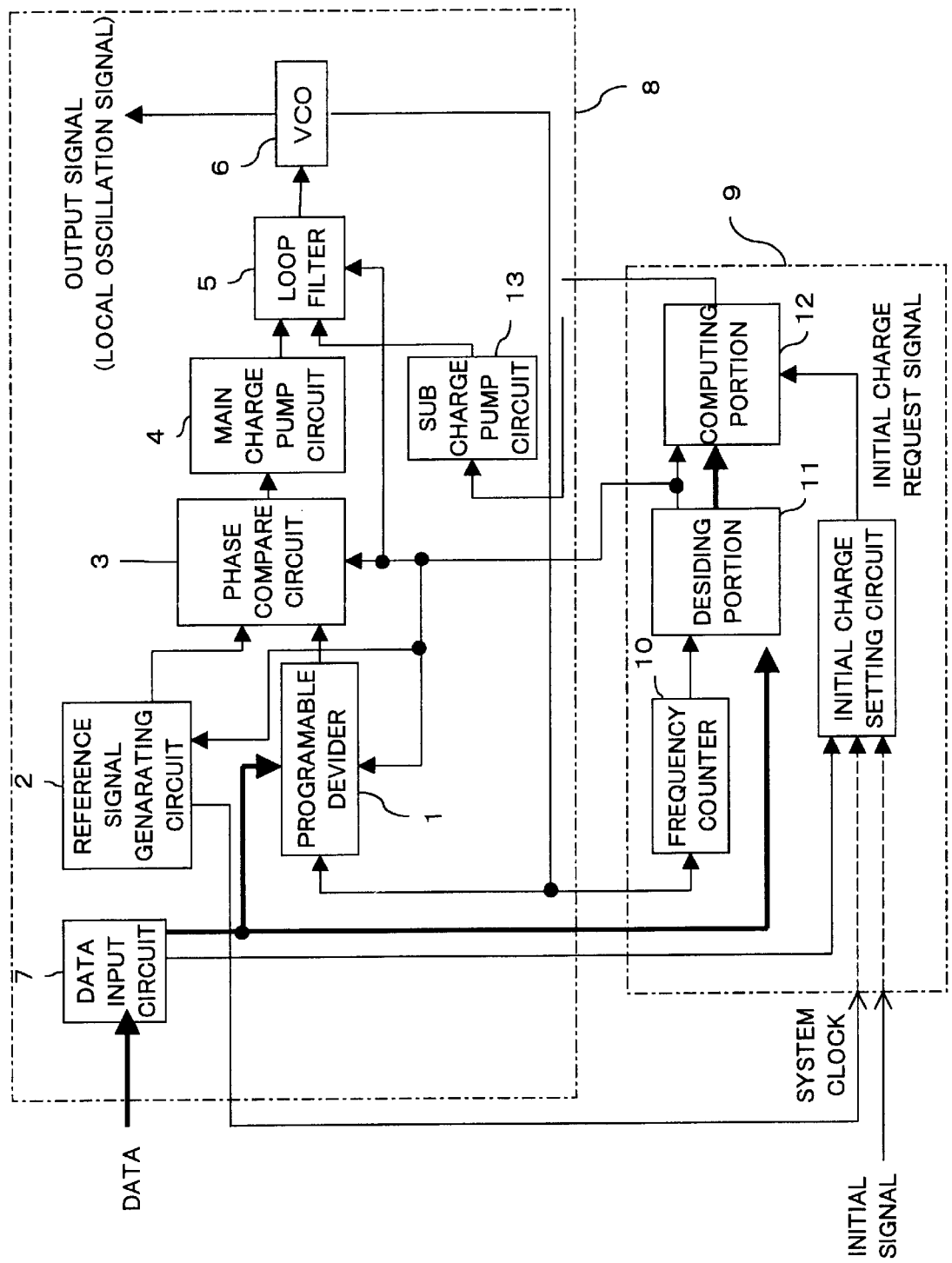
FIG. 8 is a diagram showing a structure of a PLL synthesizer circuit according to a fourth preferred embodiment of the present invention.

In this embodiment, as shown in FIG. 8, an initial charge circuit 30 is additionally provided in the frequency change circuit, for increasing a VCO control voltage at the time of turning on the power, reset requested externally, or subsequent input of frequency set data (in actuality, dividing data) so as to prevent a deadlock state.

Figure 9:
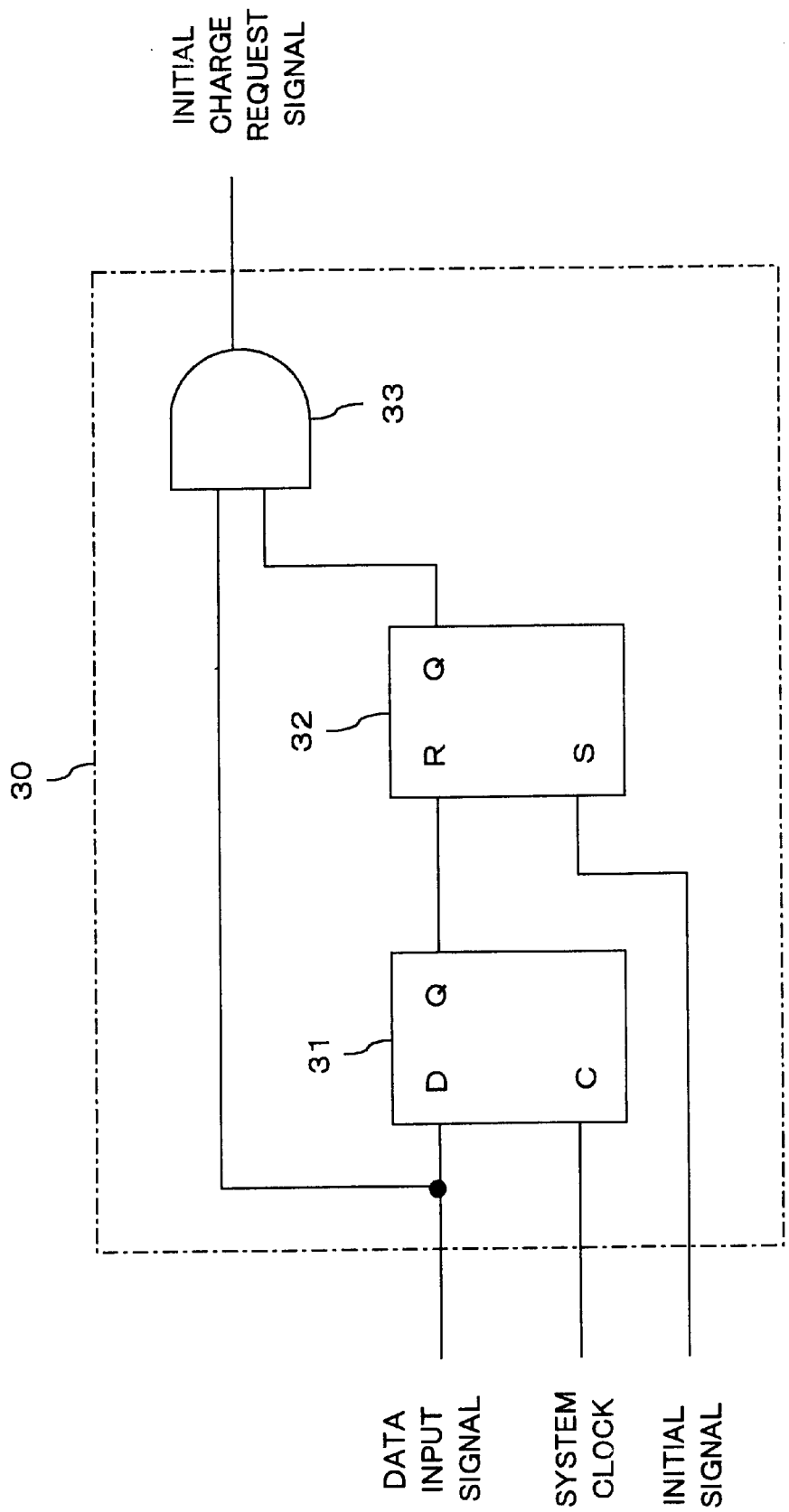
FIG. 9 is a diagram showing a structure of an initial charge setting circuit.

The initial charge circuit 30 comprises, as shown in FIG. 9, a D flip-flop 31, an RS flip-flop 32, and an AND gate 33. The D flip-flop 31 receives, via a data input signal thereof, a data input signal, which is generated when the data input circuit 7 outputs frequency set data, and via a clock terminal thereof, a system clock. The RS flip-flop 32 receives, via the reset terminal thereof, an output from the D flip-flop 31 and, via the set terminal thereof, an initial signal, which is generated when a reset request signal is generated. The AND gate 33 receives a data input signal and an output from the RS flip-flop 32.

Figure 10:
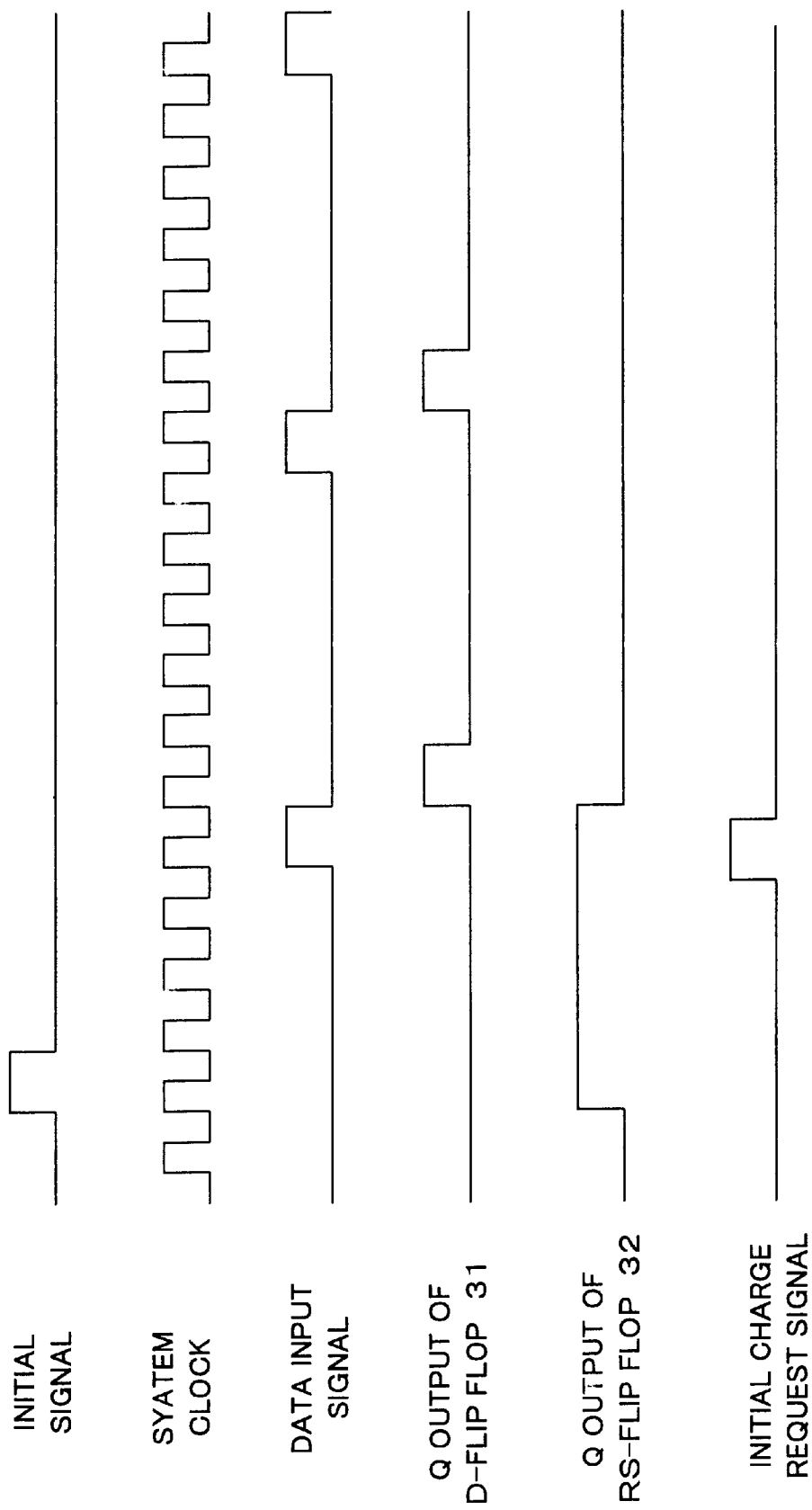
FIG. 10 is a timing chart for operation according to a fourth preferred embodiment.

Operation of the initial charge set circuit 30 will be described referring to the timing chart of FIG. 10.

In response to a reset request signal externally supplied when power is switched on, or the like, an initial signal for setting the circuit in an initial state is supplied to the initial charge set circuit. Then, the RS flip-flop 32 in the initial charge set circuit is set and accordingly outputs a signal "H". When a data input signal, indicative of an output of frequency set data, is supplied from the data input circuit 7 under the above state, because an output of the RS flip-flop 32 is H-level, a charge request signal is output from the AND gate. In short, input of a data input signal causes an output "H" from the AND gate 33. The data input signal is also supplied to the D-F/F, and, after being delayed by an amount corresponding to one system clock, the RS flip-flop circuit is reset to output a signal "L". Then, the AND gate 33 outputs a charge request signal after input of a data input signal, the change request signal remaining at H-level for a period of time corresponding to one system clock.

The charge request signal is supplied to the calculating portion 12, which in turn controls the sub-charge pump circuit 13 so as to apply a predetermined initial charge, irrespective of a signal from the deciding portion 11, to increase the control voltage for the VCO 6. In this case, with application of initial charge, 5 a control voltage is increased to be near the maximum value of a generally applied voltage to thereby ensure VCO 6 oscillation.

Even when a data input signal, indicative of input of frequency set data, is supplied from the data input circuit 7, a charge request signal is not output because of an output "L" from the RS flip-flop 32. Therefore, the calculating portion 12 applies calculation to determine a general charge application time.

Note that although the initial charge set circuit 30 outputs a charge request signal in response to input of a data input signal in the above description, output of a charge request signal is not necessarily synchronized with input of a data input signal. Rather, the calculating portion 12 may perform initial charge at the time of inputting an initial signal. In this arrangement, the deciding portion 11 may not made a determination immediately after the input of an initial signal, or the calculating portion 12 simply disregards a signal from the deciding portion 11.

As described above, in the circuit of this embodiment, a VCO control voltage can be forcibly increased at the time of reset so that erroneous operation of the circuit due to deadlock can be avoided when the power is just turned on. According to the fourth preferred embodiment, even when an VCO 6 with properties such that it does not oscillate at or around a control voltage OV is used, as the control voltage for the VCO 6 can be forcibly increased when resetting, erroneous operation of the circuit due to a deadlock state when turning on the power can be avoided.

In addition, the circuit shown in FIG. 4 can be applied to the second, third, fourth, and fifth (described later) embodiments.

Fifth Embodiment

An overall structure for a fifth preferred embodiment is basically the same as that for the first preferred embodiment, shown in FIG. 2, except that the time constant for the loop filter 5 in FIG. 1 is variable.

Figure 11:
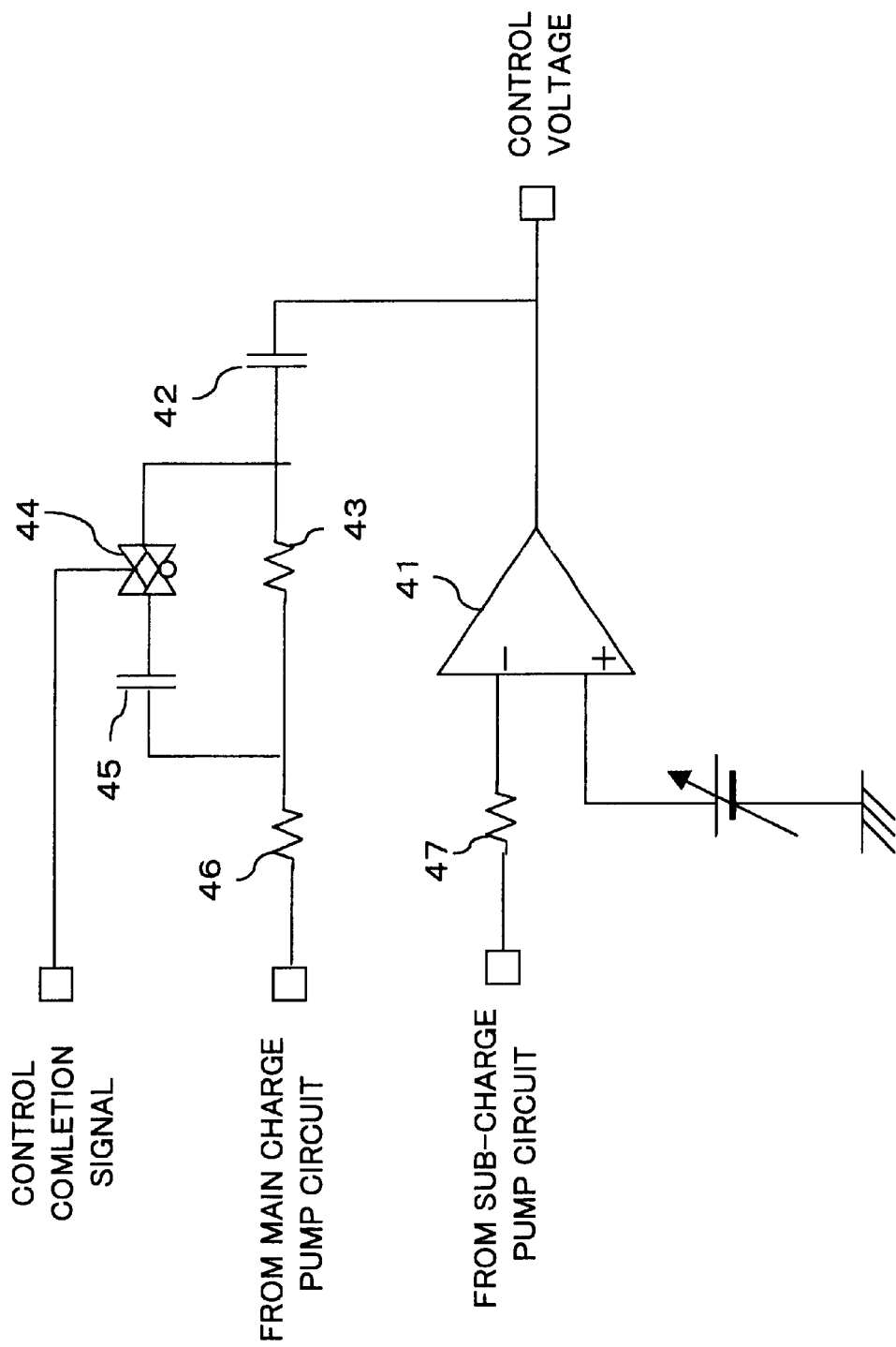
FIG. 11 is a diagram showing a structure of a loop filter according to a fifth preferred embodiment.

FIG. 11 is a diagram showing an example circuit of a loop filter 5 according to the fifth preferred embodiment, including an operation amplifier 41 having an inverse input terminal, a non-inverse input terminal, and an output terminal, a capacitor 42, a resistor 43, a transmission gate 44, a capacitor 45, a resistor 46 connected between the inverse input terminal of the operation amplifier 41 and the main charge pump circuit 4, and a resistor 47 connected between the inverse input terminal of the operation amplifier 41 and the sub-charge pump circuit 13, the capacitor 42 and the resistor 43 being directly connected in a negative feed-back path, the transmission gate 44 and the capacitor 45 being connected in parallel to the resistor 43.

When the frequency change circuit 9 is operating with a control complete signal at "L" level, the transmission gate 44 is turned off and the capacitor 45 is thereby cut off from the loop filter 5. Then, in order to raise the oscillation frequency of the VCO 6, the sub-charge pump circuit 13 outputs a signal at "L" level to the loop filter 5, as shown in FIG. 12A. Thereupon, an output level with the loop filter 5 becomes equivalent to the sum between the bias voltage, which is proportional to a resistance ratio between the resistors 43 and 47, and charge properties of the resistor 47 and the capacitor 42, gradually increasing as shown in FIG. 12B. Thereafter, the sub-charge pump circuit 13 halts outputs, becoming in high-impedance state. Output from the loop filter 5 is then reduced by an amount equivalent to the bias voltage, resultantly increased by an amount equivalent to the charge to the capacitor, compared to before an output from the sub-charge pump circuit 13 was input to the loop filter 5. Then, as the capacitor 45 is neglected, no potential is caused across the resistor 43. Therefore, an output level with the loop filter 5 becomes swiftly constant.

As shown in FIG. 12A, when the sub-charge pump 13 outputs a signal at "H" level, an output level with the loop filter 5 becomes equivalent to the sum between the bias voltage, which is proportional to a resistance ratio between the resistors 43 and 47, and discharge properties of the resistors 47 and the capacitor 42, gradually decreasing as shown in FIG. 12B. Thereafter, when the sub-charge pump circuit 13 enters a high-impedance state, output from the loop filter 5 is reduced by an amount equivalent to the bias voltage, decreased by an amount equivalent to discharge from the capacitor 42, compared to before an output from the pub-charge pump circuit 13 was input to the loop filter 5. As the capacitor 45 is then neglected, no potential is caused across the resistor 43, and an output level with the loop filter 5 therefore becomes constant.

Meanwhile, when the frequency change circuit 9 is not operating with a control complete signal at "H" level, the transmission gate 44 is turned on, and the capacitor 45 is thus connected to the loop filter 5. Then, in order to raise the oscillation frequency of the VCO 6, the main charge pump circuit 4 outputs a signal at "L" level to the loop filter 5, as shown in FIG. 13A. Thereupon, an output level with the loop filter 5 becomes equivalent to the sum between charge properties of the resistor 43 and the capacitor 45, and those of the resistor 47 and the capacitor 42, gradually increasing as shown in FIG. 13B. Thereafter, properties of the time constant of the capacitor 45 significantly appears, as shown in FIG. 13A. Thereafter, when an output from the main charge pump circuit 4 assumes a high-impedance state, output from the loop filter 5 is increased by an amount equivalent to the charge to the capacitor 42, compared to before an output from the main charge pump circuit 4 was input to the loop filter 5. Then, a potential difference is caused across the resistor 43 by the capacitor 45, so that an output level with the loop filter 5 presents discharge properties of the resistor 43 and the capacitor 45, gradually decreasing.

As shown in FIG. 13A, when the main charge pump circuit 4 outputs a signal "H" level, an output level with the loop filter 5 becomes equivalent to the sum between discharge properties of the resistor 43 and the capacitor 45, and those of the resistor 47 and the capacitor 42, gradually decreasing as shown in FIG. 13B. Thereafter, when an output from the main charge pump circuit 4 assumes a high-impedance state, output from the loop filter 5 is decreased by an amount equivalent to the discharge from the capacitor 42, compared to before an output from the main charge pump circuit 4 was input to the loop filter 5. Then, a potential difference is caused across the resistor 43 by the capacitor 45, so that an output level with the loop filter 5 presents charge properties of the resistor 43 and the capacitor 45, gradually decreasing.

As shown in FIGS. 12A, 12B, 13A, 13B, by cutting off the capacitor 45 from the loop filter 5, an output from the loop filter 5 can swiftly become constant.

As described above, according to this embodiment, when a small time constant is set with the loop filter, a time before the frequency change circuit starts frequency measurement can be reduced, and therefore a frequency control time can be accordingly reduced.

What is claimed is:

1. A PLL synthesizer circuit generating and outputting a frequency signal in accordance with input data, comprising:
   a PLL circuit; and
   a frequency change circuit connected to the PLL circuit for changing an output frequency of the PLL circuit, wherein
   the PLL circuit includes
     a voltage control oscillator having an oscillation frequency controlled in accordance with a control voltage,
     a reference signal generation circuit for generating a reference signal,
     a programmable divider coupled to receive a dividing data derived from the input data for dividing an oscillation signal of the voltage control oscillator by a dividing number in accordance with the input data,
     a phase compare circuit for comparing phases of an output signal from the programmable divider and of the reference signal,
     a charge pump circuit for outputting a signal at a voltage level in accordance with a result of comparison by the phase compare circuit, and
     a loop filter for generating the control signal for the voltage control oscillator in accordance with an output signal from the charge pump circuit, and wherein
   the frequency change circuit changes an input of the loop filter in accordance with a difference between the output frequency of the voltage control oscillator and a frequency of the dividing data irrespective of the result of comparison by the phase compare circuit, thereby changing the output frequency of the PLL circuit.

2. A circuit according to claim 1, wherein
the frequency change circuit changes the input of the loop filter when the difference between the output frequency of the voltage control oscillator and the frequency of the dividing data is within a predetermined range, and halts operation when the difference is outside the predetermined range.

3. A circuit according to claim 1, further comprising:
a sub-charge pump circuit for applying charge to the loop filter in response to an output signal from the frequency change circuit.

4. A circuit according to claim 3, wherein
the frequency change circuit comprises
a frequency counter for counting the output frequency of the PLL circuit,
a deciding portion for determining whether or not a count value counted by the frequency counter coincides with the dividing data, or whether or not the difference is in a predetermined range, and
a calculating portion for computing an amount by which the output frequency of the PLL circuit has been changed based on a determination result by the deciding portion, and for applying an output signal to the sub-charge pump circuit according to the amount computed by which the output frequency of the PLL circuit has been changed.

5. A circuit according to claim 4, wherein
the deciding portion has first computing means for computing a difference between the count value counted by the frequency counter and a frequency corresponding to the dividing data, deciding means for determining whether or not the difference is larger than a predetermined value, and means for activating the calculating portion when the difference is larger than the predetermined value.

6. A circuit according to claim 5, wherein
the calculating portion has second computing means for obtaining a first charge time, during which the loop filter is charged, by multiplying the difference in the dividing number between before and after a change of, the dividing data by a proportional constant.

7. A circuit according to claim 5, wherein
the calculating portion has third computing means for computing a second charge time, during which the loop filter is charged, by multiplying a unit change amount obtained from dividing a charge time which has been actually spent by changing amount of the output frequency of the PLL circuit and a difference between the count value counted by the frequency counter and the frequency corresponding to the dividing data.

8. A circuit according to claim 1, further comprising
a system clock stop circuit for halting supply of a system clock to the frequency change circuit depending on an operation state of the frequency change circuit.

9. A circuit according to claim 8, wherein
the frequency change circuit has a deciding portion for deciding whether or not a difference between the frequency of the dividing data and the frequency of an output from the PLL circuit is in a predetermined range, and determines whether or not to change an output frequency of the PLL circuit based on a result of determination made by the deciding portion, and
the system clock stop circuit stops supply of the system clock when the frequency change circuit is not in operation for changing the output frequency of the PLL circuit.

10. A circuit according to claim 9, wherein
the system clock stop circuit has
a state preserve circuit for receiving a data change signal and a judgement signal and for holding a control signal, and
a control gate for controlling whether or not to supply the system clock to the frequency change circuit based on an output from the state preserve circuit,
the data change signal being output when the dividing data is changed,
the judgement signal being output from the deciding portion in the frequency change circuit,
the control signal controlling start or stop of supply of the system clock depending on a state of the data change signal and the judgement signal.

11. A circuit according to claim 1, wherein
the frequency change circuit further includes a frequency counter for counting the output signal from the PLL circuit during a predetermined gate time to detect the frequency of the output signal from the PLL circuit, and a gate time set circuit for determining a gate time for the frequency counter based on a difference between a count value counted by the frequency counter and the frequency of the dividing data.

12. A circuit according to claim 11, further comprising
a timer circuit for outputting a gate signal indicative of a gate time according to an output from the gate time set circuit, and
a gate circuit for supplying the output signal from the PLL circuit to the frequency counter during a period of time indicated by the gate signal from the timer circuit.

13. A circuit according to claim 12, further comprising a data shift circuit for shifting a count value according to a gate time, the count value being an output from the frequency counter.

14. A circuit according to claim 1, wherein
the frequency change circuit controls in response to a reset request signal such that the output frequency of the PLL circuit becomes an initial value.

15. A circuit according to claim 14, wherein
the frequency change circuit includes an initial charge set circuit for outputting an initial charge application request signal based on input of a reset request signal and a data input signal, and controls, in response to the initial charge application request signal, such that the output frequency of the PLL circuit becomes the initial value,
the data input signal being output when a frequency is set.

16. A circuit according to claim 1, wherein
the PLL circuit has a loop filter, of which time constant is changed to be set different when the frequency change circuit carries out operation for changing the output frequency of the PLL circuit and when it does not.

17. A circuit according to claim 16, wherein
the time constant of the loop filter is set smaller when the frequency change circuit carries out operation for changing the output frequency of the PLL circuit than when it does not.

18. A circuit according to claim 17, wherein the time constant of the loop filter is set at a first value when the frequency change circuit carries out operation for changing the output frequency of the PLL circuit, and switched to be set at a second value when the frequency change circuit completes the operation for changing the output frequency of the PLL circuit, the second value being larger than the first value.

19. A method for controlling an output frequency of a PLL circuit having a frequency change circuit coupled to an output terminal of the PLL circuit for generating and outputting a frequency signal to the PLL circuit for changing the output frequency according to dividing data derived from an input data inputting to a frequency divider of the PLL circuit, comprises the step of changing the output frequency of the PLL circuit according to a difference between the output frequency of the PLL circuit and a frequency corresponding to the dividing data, irrespective of a phase difference in a phase comparator of the PLL circuit.

20. A method according to claim 19, wherein the PLL circuit has a loop filter circuit coupled to a voltage control oscillation circuit, and, the frequency signal changes an input of the loop filter circuit.

* * * * *